(12) United States Patent
Lugue et al.

(10) Patent No.: US 12,459,027 B2
(45) Date of Patent: Nov. 4, 2025

(54) PRODUCTION METHOD FOR INTEGRATED CIRCUITS

(71) Applicant: TEXAS INSTRUMENTS INCORPORATED, Dallas, TX (US)

(72) Inventors: Jefferson Ochoa Lugue, Baguio (PH); Christopher Frederick Abrenica Binegas, Baguio (PH)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1933 days.

(21) Appl. No.: 15/871,730

(22) Filed: Jan. 15, 2018

(65) Prior Publication Data

US 2019/0201963 A1  Jul. 4, 2019

Related U.S. Application Data

(60) Provisional application No. 62/612,285, filed on Dec. 29, 2017.

(51) Int. Cl.
*H01L 21/56* (2006.01)
*B21D 28/14* (2006.01)
(Continued)

(52) U.S. Cl.
CPC ........... *B21D 28/14* (2013.01); *B21D 43/025* (2013.01); *B21D 45/003* (2013.01); *B21D 45/02* (2013.01); *B23P 19/025* (2013.01); *H01L 21/561* (2013.01); *H01L 24/95* (2013.01); *H01L 23/3107* (2013.01); *H01L 24/97* (2013.01);
(Continued)

(58) Field of Classification Search
CPC ... H01L 21/52; H01L 21/561; H01L 2021/60; H01L 2021/60285; H01L 23/3107; H01L 24/95; H01L 24/97; H01L 2924/00012; H01L 2924/14; H01L 2924/181; H01L 21/67144; H01L 21/67138; H01L 23/495; H01L 23/49517; H01L 23/4954; H01L 21/4842; B21D 28/14; B21D 45/003; B21D 45/02; B21D 43/025; B23P 19/025; Y10T 29/49121; Y10T 29/53174; Y10T 29/53178; Y10T 29/53209
See application file for complete search history.

(56) References Cited

U.S. PATENT DOCUMENTS 4,064,917 A * 12/1977 Diaz ................. H01L 21/67138
72/330
4,885,837 A * 12/1989 Eshima ............. H01L 21/67144
29/827

(Continued)

FOREIGN PATENT DOCUMENTS

JP          10229156 A * 8/1998

*Primary Examiner* — A. Dexter Tugbang
(74) *Attorney, Agent, or Firm* — Ronald O. Neerings; Frank D. Cimino

(57) ABSTRACT

An integrated circuit production method. In some examples, the method includes receiving a leadframe comprising a plurality of in-production ICs in a forming machine, singulating the plurality of in-production ICs, forming leads of at least some of the plurality of in-production ICs to comply with dimensions and tolerances corresponding to an intended form factor of the plurality of in-production ICs, and separating, automatically by the forming machine, formed ICs from unformed ICs after the forming.

31 Claims, 6 Drawing Sheets

(51) Int. Cl.
*B21D 43/02* (2006.01)
*B21D 45/00* (2006.01)
*B21D 45/02* (2006.01)
*B23P 19/02* (2006.01)
*H01L 23/00* (2006.01)
*H01L 25/00* (2006.01)
*H01L 23/31* (2006.01)

(52) U.S. Cl.
CPC .... *H01L 2924/14* (2013.01); *H01L 2924/181* (2013.01)

(56) References Cited

U.S. PATENT DOCUMENTS

| | | | | |
|---|---|---|---|---|
| 5,146,662 | A | * | 9/1992 | Fierkens ............. H01L 21/4842 29/25.03 |
| 5,271,146 | A | * | 12/1993 | Kashiwagi ........ Y10T 29/49121 140/105 |
| 5,549,716 | A | * | 8/1996 | Takahashi ......... Y10T 29/49121 29/25.01 |
| 6,845,554 | B2 | * | 1/2005 | Frankowsky ..... Y10T 29/53178 29/832 |
| 2013/0102093 | A1 | * | 4/2013 | Ogawa ................... H01L 24/97 438/15 |

* cited by examiner

PRODUCTION METHOD FOR INTEGRATED CIRCUITS

CROSS-REFERENCE TO RELATED APPLICATIONS

The present application claims priority to U.S. Provisional Patent Application No. 62/612,285, which was filed Dec. 29, 2017, is titled "Component Forming Machine With Jammed Component Mitigation," and is hereby incorporated herein by reference in its entirety.

BACKGROUND

During the production process of integrated circuits (ICs), testing may be performed to verify acceptable performance of produced ICs. Acceptable performance may describe the existence of electrically conductive coupling between two nodes, passage of a visual (e.g., x-ray, electron microscope, photographic, etc.) inspection, a power-up test, a functional test, or any other form of performance metric that may be used as a threshold determination for determining acceptable performance of a produced IC. The testing may be performed manually, autonomously, or semi-autonomously. For example, a technician may load produced components into a machine that may orient the produced components for testing. The components may be loaded in bulk (e.g., by dumping a large container of components into the machine for the machine to subsequently sort and orient over time). In at least one example, the machine may also perform the testing, while other examples of the machine may pass the oriented components on to a subsequent machine to perform the testing. In some circumstances, some of the components may have been produced incorrectly. For example, when a produced IC includes a package having metal leads extending outward from a body of the IC package (e.g., such as an IC packaged in a small outline transistor (SOT)-23 form factor), not all of the metal leads may be formed properly. As an example, at least some of the metal leads of at least some of the produced ICs may have a shape that is outside of accepted tolerances for metal leads for a designated form factor of the IC package.

SUMMARY

In at least one example, a component forming machine with jammed component mitigation. In some examples, the component forming machine can include a platform configured to receive a lower die that supports a plurality of components for forming and includes a void through which at least some of the plurality of components pass subsequent to the forming, a die press positioned above the lower die and configured to lower an upper die to exert downward pressure on the plurality of components to form unformed components and formed components, and a separation system. In some examples, the separation system is configured to interact with the lower die to permit the formed components to fall into the void and prevent the unformed components from falling into the void.

In another example, an integrated circuit (IC) production system, comprising a means for transporting a leadframe comprising in-production ICs through a forming machine, a means for singulating the in-production ICs from the leadframe, a means for forming the in-productions ICs according to dimensions of a desired form factor upon which the forming is at least partially based, and a means for automatically separating formed ICs from unformed ICs after the forming without human intervention to perform the separating.

In yet another example, an IC production method, comprising receiving, by an IC forming machine, a leadframe comprising a plurality of in-production ICs, singulating, by the IC forming machine, the plurality of in-production ICs, forming, by the IC forming machine, leads of at least some of the plurality of in-production ICs to comply with dimensions and tolerances corresponding to an intended form factor of the plurality of in-production ICs; and separating, automatically by the forming machine, formed ICs from unformed ICs after the forming.

BRIEF DESCRIPTION OF THE DRAWINGS

For a detailed description of various examples, reference will now be made to the accompanying drawings in which.

DETAILED DESCRIPTION

Figure 1:
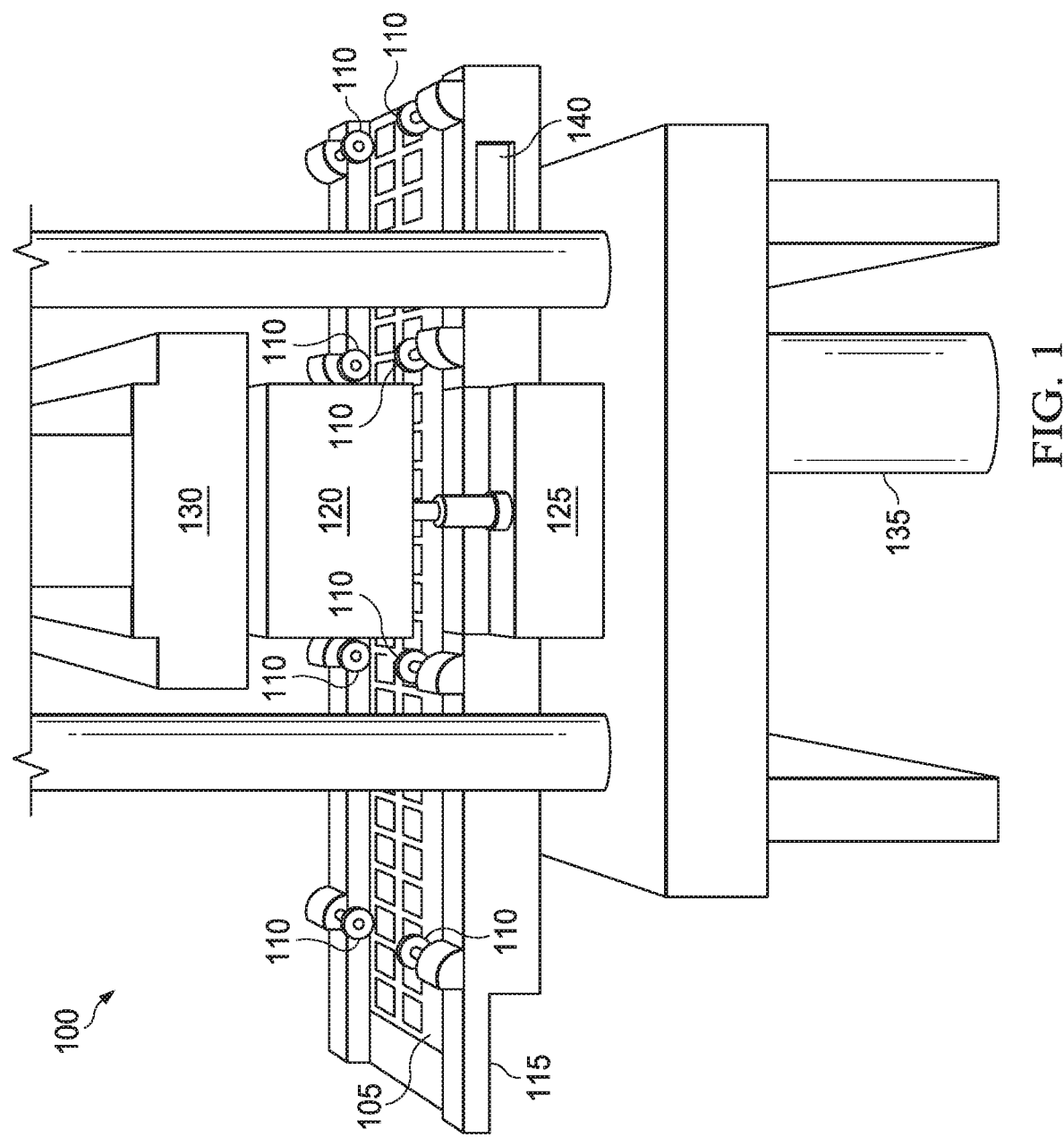
FIG. 1 shows a perspective view of an illustrative component forming machine including a separation system.

When produced integrated circuits (ICs) include some ICs that have not been properly formed, jams may form at the machine orienting the produced ICs for testing. For example, the machine may include an opening for the produced ICs to pass through as a part of the orienting and the opening may have certain dimensions and/or tolerances corresponding to the designated form factor of the IC package. When a produced IC that has not been properly formed reaches the opening, the produced IC that has not been properly formed may fail to go through the opening (or may go through the opening and subsequently become jammed), thereby blocking progress of further produced ICs through the opening. In at least one example, to clear the jam the technician may return to manually remove the jammed IC. This manual clearing may result in a shutdown of the machine (as well as the possibility for shutdown of other machines related to the testing or pre-testing production). Such shutdowns may decrease efficiency and increase cost in producing the ICs and performing their related testing (e.g., at least partially as a result of a reduction in equipment uptime).

Aspects of the present disclosure provide for separation of unformed ICs from formed ICs. In at least one example, the separation may be performed at a time of collection of the formed ICs from an IC forming machine. In other examples, the separation may be performed as a part of the forming operation performed by the forming machine, subsequent to forming of the ICs and collection of both the formed ICs and unformed ICs in a shared carrier, or at any other suitable stage of the production and testing process for ICs. As used herein, a formed IC refers to a produced IC that conforms to accepted physical tolerances for a designated form factor of the IC package and an unformed IC refers to a produced IC that does not conform to accepted physical tolerances for a designated form factor of the IC package.

To separate the unformed ICs from the formed ICs, in at least one example the forming machine may comprise a separation system suitable for performing the separation. Some examples of the separation system may provide for aperture based separation. For example, the separation system may include one or more openings through which only some of the formed ICs or the unformed ICs may pass (e.g., such that the formed ICs pass through the separation system and the unformed ICs do not pass through the separation system or vice versa). Other examples of the separation system may be pneumatic (e.g., using air pressure to dislodge an unformed IC from a path along which formed ICs pass), may vary a path along which the formed and/or unformed ICs pass, (e.g., such as gates that articulate to disrupt a path of the unformed ICs and/or the formed ICs), or any other suitable separation technique. In at least one example, the separation system may be integrated into the forming machine, such as at a time of manufacturing of the forming machine. Other examples of the separation system may be fabricated separately from the forming machine and may be subsequently installed on the forming machine, for example, in a removable manner. At least some aspects of the separation system may be adjustable. For example, aspects of the separation system may be adjustable to accommodate mounting to various forming machines having differing dimensions and/or characteristics and/or adjustable to accommodate varying form factors for IC packages.

Turning now to FIG. 1, a perspective view of an illustrative component (e.g., IC) forming machine 100 is shown. In at least one example, the forming machine 100 includes a transportation mechanism 110, a platform 115, an upper die 120, a lower die 125, and a die press 130, and may include, be configured to receive, and/or otherwise interact with a first collection container 135 and a second collection container 140. In at least one example, the upper die 120 is coupled to the die press 130 such that movement of the die press 130 correspondingly causes movement of the upper die 120. In at least one example, the platform 115 is configured to receive the lower die 125 such that the lower die 125 may be positioned beneath the upper die 120 and a leadframe 105 advanced through the forming machine 100 via the transportation mechanism 110 passes over the lower die 125. In at least one example, the upper die 120 and the lower die 125 may be referred to as a forming tool. The forming machine 100 may be configured to at least partially form IC packages. For example, the forming machine 100 may receive a leadframe 105 containing a plurality of in-production ICs. The in-production ICs may be ICs for which a package body has been molded around a die of the IC, and thus steps of IC production prior to receipt of the leadframe 105 by the forming machine 100 are omitted herein. The in-production ICs may be coupled to the leadframe 105 by one or more leads of the in-production ICs. The forming machine 100 may at least partially form IC packages by singulating the in-production ICs and forming the leads of the in-production ICs to form the formed ICs.

Figure 2:
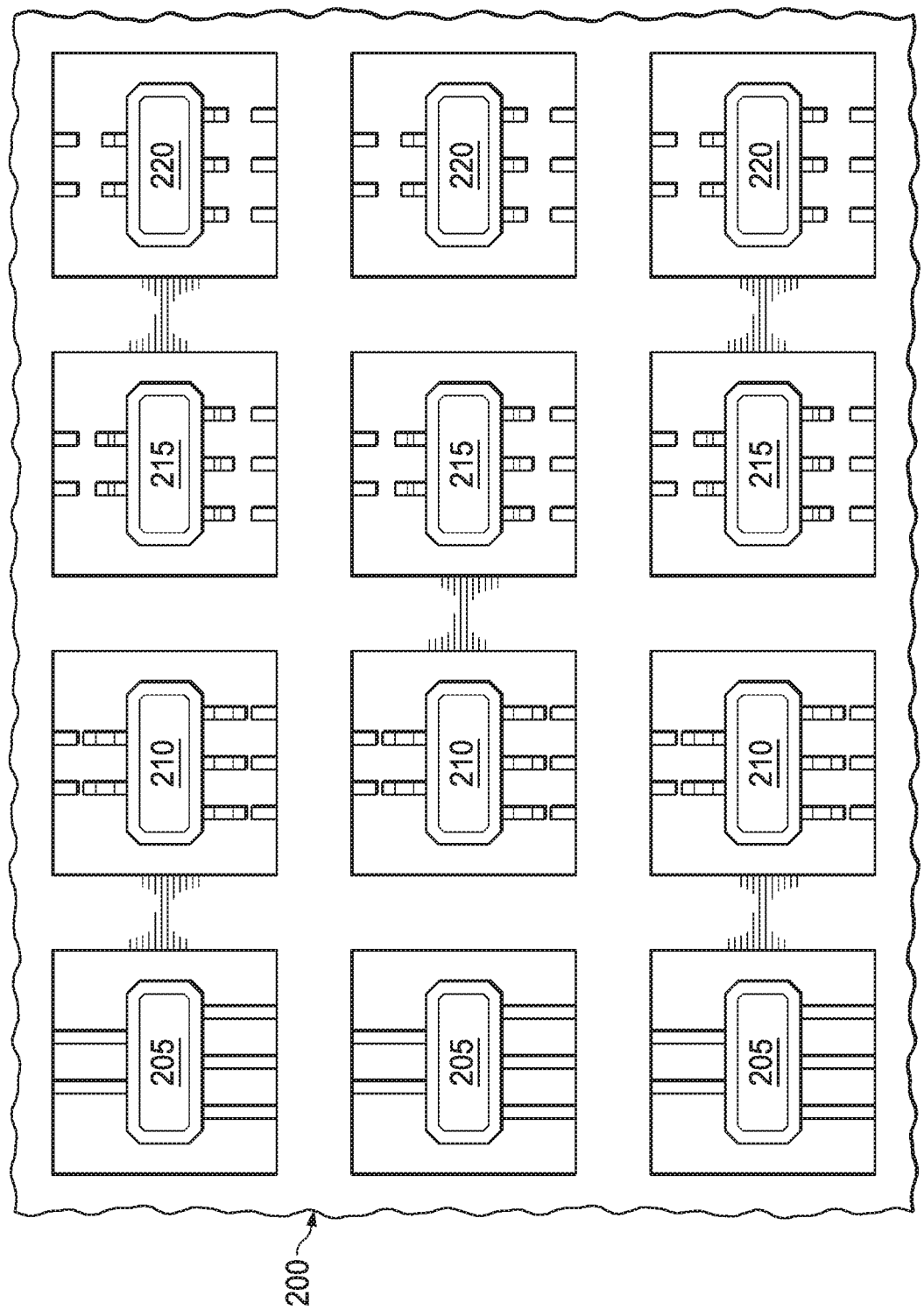
FIG. 2 shows a top view of an illustrative leadframe.
Figure 3A:
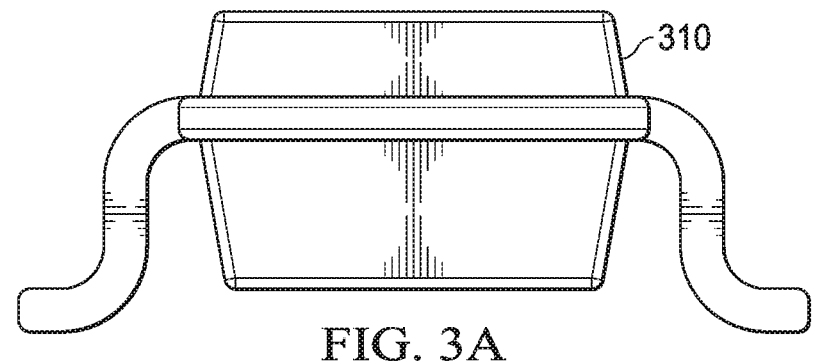
FIG. 3A shows an illustrative formed integrated circuit (IC)
Figure 3B:
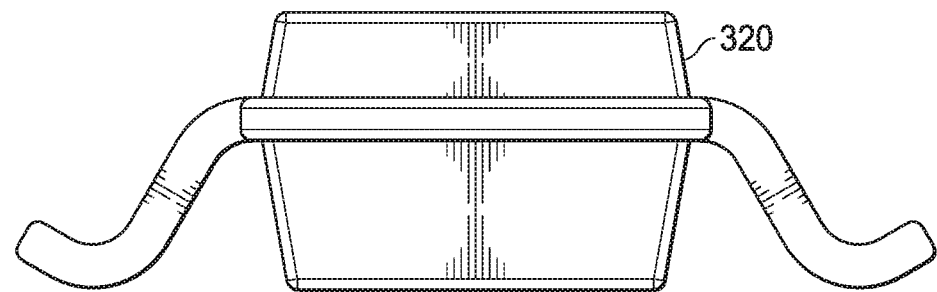
FIG. 3B shows an illustrative unformed IC.
Figure 3C:
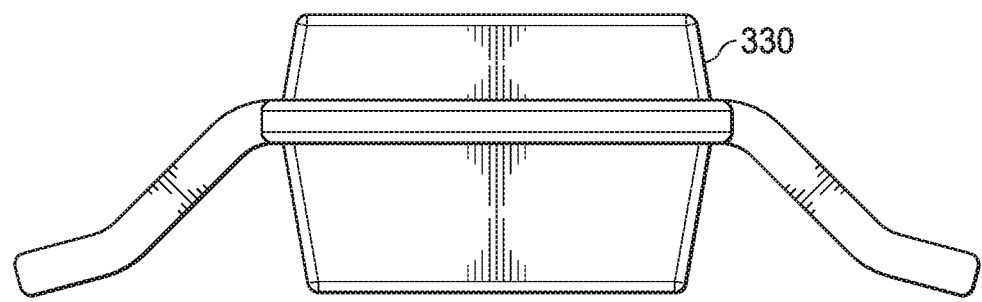
FIG. 3C shows another illustrative unformed IC.

FIG. 2 is a top view at least one example of an illustrative leadframe 200, at least some aspects of which may be representative of the leadframe 105 of FIG. 1. In the leadframe 200, ICs 205 are illustrative ICs that are coupled to the leadframe 200 prior to singulation, ICs 210 are illustrative ICs that have been singulated but have not yet undergone forming, ICs 215 are illustrative ICs that have undergone a first forming process, and ICs 220 are illustrative ICs that have undergone a second forming process. In at least one example, the ICs 220 may include formed ICs and unformed ICs, as discussed herein. FIGS. 3A, 3B, and 3C illustrate various examples of formed ICs and unformed ICs. For example, FIG. 3A illustrates one example of a formed IC 310, FIG. 3B illustrates one example of an unformed IC 320, and FIG. 3C illustrates one example of an unformed IC 330.

Returning now to FIG. 1, when the forming machine 100 receives the leadframe 105 containing the in-production ICs, the forming machine first singulates at least a portion of the in-production ICs from the leadframe 105. For example, the forming machine 100 may singulate the in-production ICs from the leadframe 105 by lowering the die press 130 to apply downward pressure to leads of the in-production ICs via the upper die 120 to separate the leads (and correspondingly, the in-production ICs) from the leadframe 105. In at least one example, the upper die 120 may include an angled (or beveled) surface (not shown) that may cut through the leads to separate the leads from the leadframe 105 while other examples of the upper die 120 may shear the leads from the leadframe 105 using pressure without an angled surface. In at least one example, the forming machine 100 may singulate one column of in-production ICs from the leadframe 105 with one downward action of the die press 130 while other examples may singulate any desirable number of in-productions ICs from the leadframe 105 with each downward action of the die press 130. In at least one example, the downward action (and subsequent upward action) of the die press 130 may be controlled according to any suitable means such as pneumatically, hydraulically, and/or electrically (not shown). In at least one example, the forming machine 100 may singulate the in-production ICs from the leadframe 105 by lowering the die press 130 to apply downward pressure to the leadframe 105 via the upper die 120 without directly applying downward pressure to the leads of the in-production ICs or to bodies of the in-production ICs to separate the leads (and correspondingly, the in-production ICs) from the leadframe 105.

In at least one example, the platform 115 may be a movable platform. For example, the platform 115 may operate to advance the leadframe 105 through the forming machine 100, such as by advancing the leadframe through the forming machine 100 by a distance based on a number of columns of in-production ICs that are singulated by the forming machine 100 with each downward action of the die press 130. At least one example of the platform 115 may operate substantially as a conveyor belt. Another example of the platform 115 may be a stationary platform. In such an example, the transportation mechanism 110 may operate to advance the leadframe 105 through the forming machine 100 as discussed above. In at least one example, the transportation mechanism 110 is a sprocket system mating with matching holes in the leadframe and spinning to advance the leadframe, and/or a roller spinning against a surface of the leadframe while under pressure to advance the leadframe at least partially via frictional forces.

After an in-production IC has been singulated from the leadframe, the in-production IC may, although physically detached from the leadframe 105, remain within a section or frame (e.g., an opening) of the leadframe 105 in which the in-production IC was previously connected to the leadframe 105. In this way, when the leadframe 105 is advanced through the forming machine 100 (e.g., by the platform 115 or the transportation mechanism 110), physical positions of the in-production ICs that have been singulated may be correspondingly advanced through the forming machine 100 (e.g., by the forming machine 100 advancing the leadframe 105 through the forming machine 100 and the leadframe 105 dragging the in-production ICs).

After singulating the in-production ICs, the forming machine 100 may form the in-production ICs through one or more forming operations. For example, the forming machine 100 may form the in-production ICs by bending the leads of the in-production ICs to form the formed ICs. Bending the leads of the in-production ICs may stress the leads and in some circumstances may damage or break the leads. To mitigate this potential for damage, the leads may be bent progressively through the one or more forming operations until a final bent shape of the leads is achieved and the formed ICs are completed. In at least one example, the upper die 120 and/or the lower die 125 may include forming sections that may be shaped to at least partially form the in-production ICs into the formed ICs through progressive application of downward pressure by the upper die 120 via downward action of the die press 130, where each progressive application further forms the in-production ICs into the formed ICs. In this way, in some examples of the forming machine 100, while a first portion of in-production ICs of the leadframe 105 are being singulated during a downward action of the die press 130, a second portion of the in-production ICs (e.g., in-production ICs that have been singulated) may undergo a first forming operation. Similarly, when the forming machine 100 includes second or subsequent forming operations, a third (or other subsequent) portion(s) of the in-production ICs may undergo those forming operations during a same downward action of the die press 130 as the singulating of the first portion of in-production ICs and the first forming operation of the second portion of in-production ICs. An in-production IC advancing beyond a final forming operation of the forming machine 100 may be a formed IC (e.g., when the singulating and each of the forming operations has been performed successfully) or may be an unformed IC (e.g., when at least one of the singulating or one of the forming operations has not been performed successfully).

In at least one example, the forming machine 100 may further include grooves, ridges, guides, or other physical structures or characteristics in a surface of the lower die 125 to aid in the forming operations and/or advancement of the in-production ICs through the forming machine 100. For example, a first portion of the lower die 125 may include first physical characteristics corresponding to a desired shape and/or amount of bend of the leads of the in-production ICs to be performed during the first forming operation, and an Nth portion of the lower die 125 may include Nth physical characteristics corresponding to a desired shape and/or amount of bend of the leads of the in-production ICs to be performed during the Nth forming operation, where N is a number of forming operations to be performed by the forming machine 100 through application of downward pressure by the die press 130 on the in-production ICs to form the in-production ICs into the formed ICs. As another example, the lower die 125 may include one or more guides that may aid in positioning the in-production ICs on the lower die 125 as the leadframe 105 and the in-production ICs are advanced through the forming machine 100. The grooves, ridges, guides, or other physical structures In at least one example, the upper die 120 may include complementary physical characteristics (not shown) that, together with the physical characteristics of the lower die 125, may at least partially aid in the forming operations of the in-production ICs. In at least one example, the guides may correspond to a body width of the in-production ICs such that the in-production ICs may be advanced through the forming machine by the leadframe 105 dragging the components along a path at least partially defined or bounded by the guides.

After performing the final forming operation of the forming machine 100, the forming machine 100 (e.g., via the transportation mechanism 110) advances the formed ICs and the unformed ICs (collectively referred to as the completed ICs) forward by further advancing the leadframe 105. In at least one example, the completed ICs are advanced over a void in the lower die 125 (e.g., not shown in FIG. 1 but illustrated as the void 420 in the top view of an illustrative lower die 400, described below with reference to FIG. 4). In another example, the lower die 125 ends prior to the void. In another example, a second platform (not shown) may be arranged such that the leadframe 105 and completed ICs pass from the lower die 125 to the second platform which may include the void.

In at least one example, lower die 125 includes, or is configured to couple to, a separation system (not shown) that may be arranged over the void in the lower die 125. In at least one example, the separation system is integrated into the lower die 125. In another example, the separation system is coupled (e.g., detachably-coupled) to the lower die 125. Various examples of the separation system may be coupled to the lower die 125 via mechanical fasteners (e.g., screws), a clamping mechanism, adhesive, and/or any other suitable means. In at least one example, the lower die 125 may include a plurality of sections that may be detachably coupled to the lower die 125, and the separation system may be one of the sections. In another example, the separation system may be coupled to one of the plurality of sections (e.g., via adhesive, screws, etc.).

The separation system may be suitable for separating the unformed ICs from the formed ICs in the group of completed ICs. For example, the separation system may provide aperture-based separation of the unformed ICs from the formed ICs. At least one example of the separation system may include rails overlapping at least a portion of the void. A distance separating a first rail of the separation system from a second rail of the separation system may be determined according to dimensions and/or tolerances corresponding to a form factor of the formed IC. For example, the distance separating the first rail and the second rail may be determined such that the distance is large enough to allow the formed ICs to fall through the void and into the first collection container 135 (when the first collection container 135 is arranged to collect formed ICs falling through the void) when the completed ICs are advanced over the void. The distance separating the first rail and the second rail may also be determined such that the distance is small enough to prevent the unformed ICs from falling through the void to the first collection container 135. As the leadframe 105 is further advanced by the forming machine 100, the unformed ICs which have been retained on a top surface of the rails of the separation system may be further advanced until the unformed ICs fall into the second collection container 140 (when the second collection container 140 is arranged to collect unformed ICs separated by the separation system).

Some aspects of the separation system may be adjustable and/or replaceable. For example, the separation system may be adjustable to vary a distance between the first rail and the second rail to accommodate dimensions and/or tolerances corresponding to form factors of other ICs. The separation system may be further, or alternatively, adjustable to facilitate coupling the separation system to various forming machines having varied dimensions. In another example, multiple separation systems may be alternatively coupleable to the lower die 125, for example, to accommodate dimensions and/or tolerances corresponding to form factors of other ICs. The separation system may be constructed of any one or more suitable materials such as metal and/or plastic.

Figure 4:
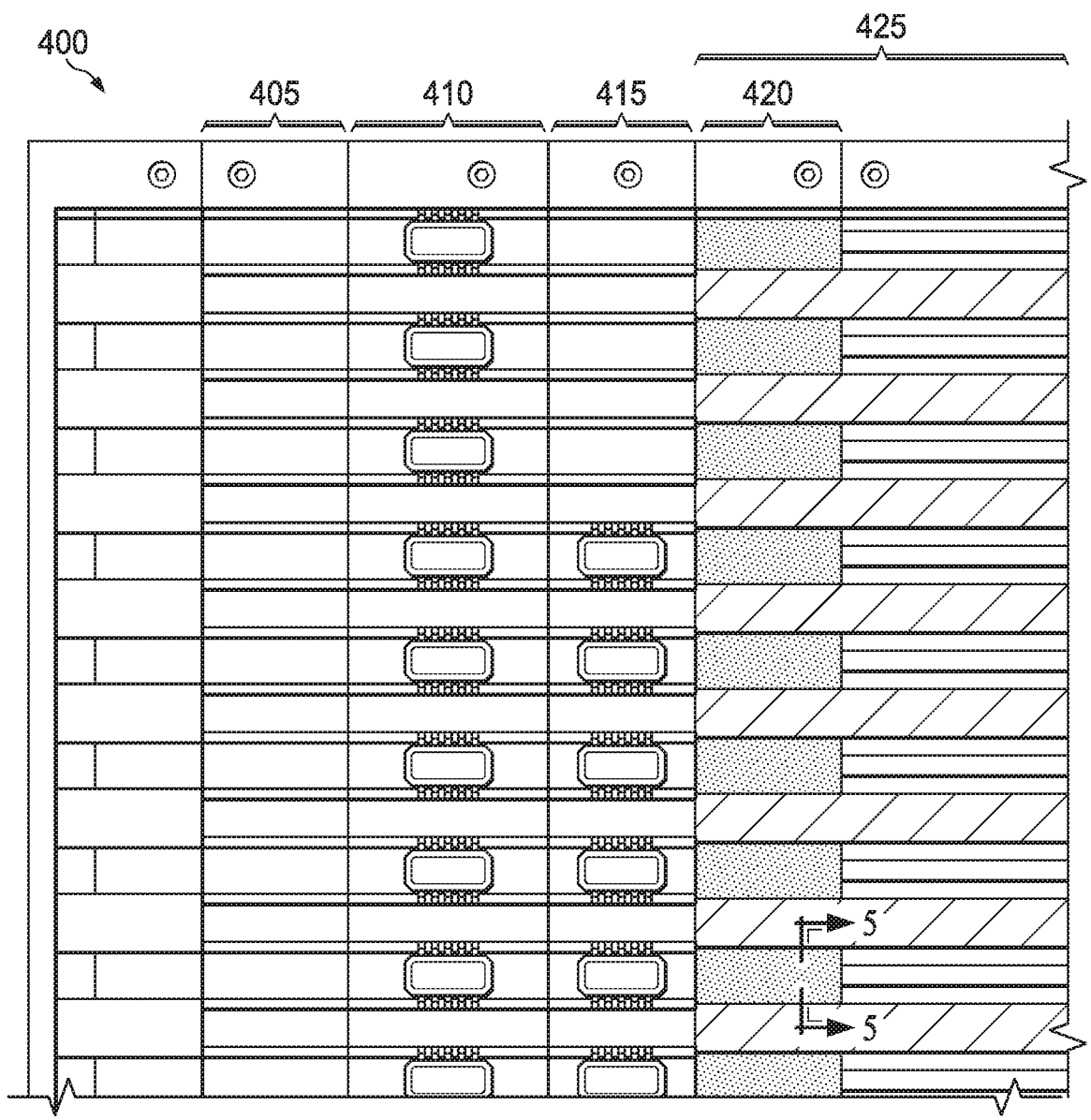
FIG. 4 shows a top view of an illustrative forming machine lower die.

Referring now to FIG. 4, a top view of an illustrative forming machine lower die 400 is shown. The lower die 400 may include a singulating section 405, a first forming section 410, a second forming section 415, a void 420 (e.g., illustrated using halftone shading and extending from the top to the bottom of the lower die 400 through the lower die 400), and a separation system 425. In at least one example, at least some of the singulating section 405, the first forming section 410, the second forming section 415, and/or the separation system 425 are detachably coupled to the lower die 400 via screws (e.g., such as modular components that are selectively removable and replaceable on the lower die 400).

Although illustrated as including a first forming section 410 and a second forming section 415, in at least one example the lower die 400 may include any number of forming sections according to a desired number of forming operations in forming an in-production IC into a formed IC, as discussed above with reference to FIG. 1. In such an example, the second forming section 415 may be omitted or the lower die 400 may include additional forming sections (not shown) positioned between the second forming section 415 and the void 420.

As a leadframe of in-productions ICs passes over the lower die 400, the in-production ICs may pass over (or be guided through grooves or other guides of) the sections of the lower die 400, for example, to singulate and/or form the in-production ICs in conjunction with a downward action of a corresponding upper die (not shown). In at least one example, the in-production ICs advance linearly from the singulating section 405 to the first forming section 410 and the second forming section 415 before either advancing to, and falling through, the void 420 (e.g., for formed ICs) or further advancing along through the separation system 425 (for unformed ICs). The advancement of the in-production ICs may be controlled by movement of the leadframe and may be at least partially guided by physical characteristics (e.g., such as grooves, guides, or other structures) of the lower die 400, each as discussed above with reference to FIG. 1. In at least one example, the downward action of the upper die (e.g., as discussed above with respect to FIG. 1) exerts pressure on leads of the in-productions ICs that, when pressed against at least some of the various sections of the lower die 400, singulate and/or form the in-production ICs into the formed ICs and/or the unformed ICs. For example, at least some of the singulating section 405, the first forming section 410, and/or the second forming section 415 include grooves, ridges, or other physical structures that interact with the leads of the in-production ICs to at least partially aid in singulating and/or forming the in-production ICs when the upper die exerts pressure on the leads of the in-production ICs.

Figure 5A:
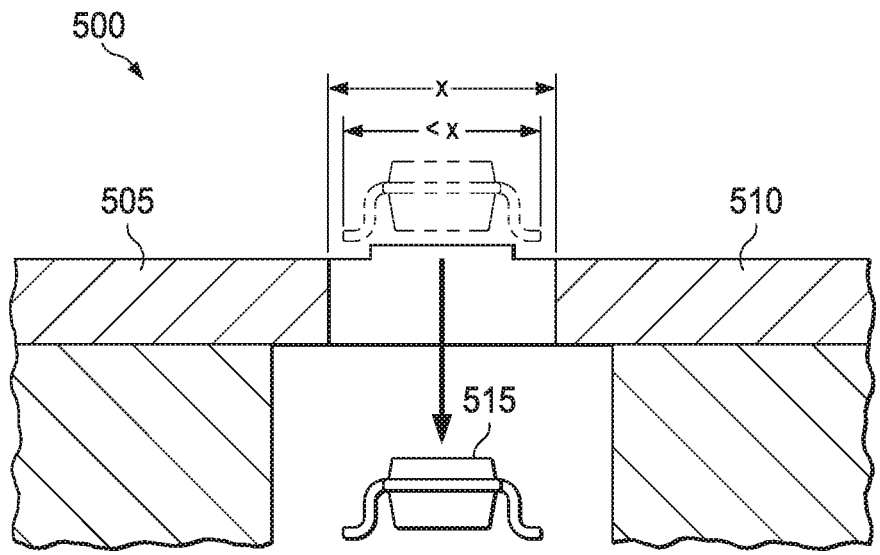
FIG. 5A shows a cross-sectional view of an illustrative separation system.
Figure 5B:
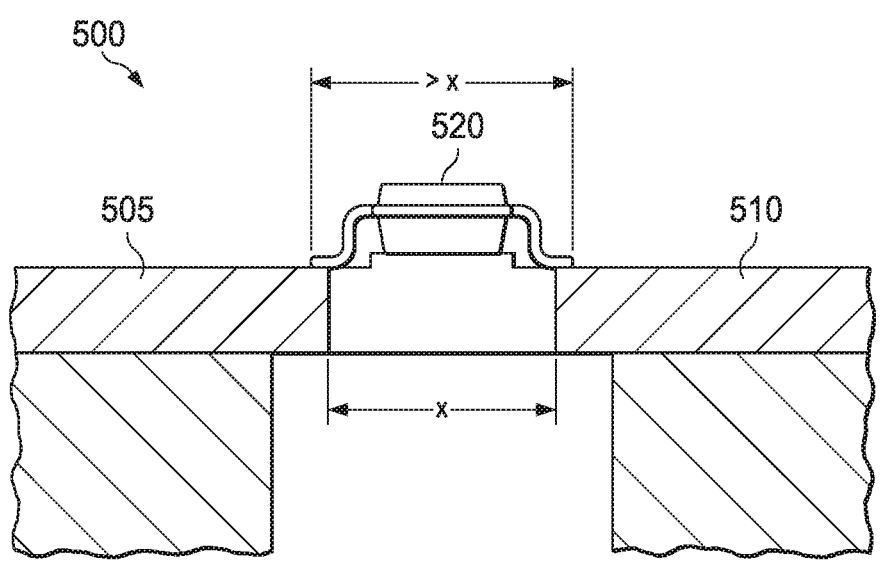
FIG. 5B shows another cross-sectional view of an illustrative separation system.

Referring now to FIGS. 5A and 5B, partial cross-sectional views of an illustrative separation system 500 are shown. At least some aspects of FIGS. 5A and 5B may illustrate partial cross-sectional views of a portion of the separation system 500 that may overlap a void. For example, FIGS. 5A and 5B may illustrate partial cross-sectional views of the separation system 425 along cross-sectional line 5 as the separation system 425 would overlap the void 420 in the lower die 400 of FIG. 4. In at least one example, the separation system 500 comprises a first rail 505 and a second rail 510 and may be implemented as the separation system 425, described above with reference to FIG. 4. In at least one example, the rails 505 and 510 may be incorporated as a part of, affixed to, or overlaying at least a portion of an IC forming machine, such as the forming machine 100, described above with reference to FIG. 1. For example, the rails may be arranged on opposing sides of a void in the forming machine through which a portion of completed ICs should pass and through which a portion of the completed ICs should not pass. As shown in FIG. 5A, a formed IC 515 may fall through the separation system 500 when the separation system 500 is arranged above a void and the formed IC 515 has a width less than a width of an opening in the separation system 500, where the width of the opening in the separation system 500 is designated as x. The width of the opening in the separation system 500 may be at least partially determined according to dimensions and/or tolerances corresponding to the form factor of the formed IC 515. At least some examples of the separation system 500 may be configurable such that the width of the opening in the separation system 500 may be configurable, for example, to correspond to varying form factors for the formed IC 515. The separation system 500 may be configurable according to any suitable means such as having a plurality of mounting holes for repositioning the separation system 500 with respect to a structure on which the separation system 500 is mounted, a threaded spindle and nut, or any other means for adjusting the width of the opening in the separation system 500. In other examples, the width of the opening in the separation system 500 may be set at a specific desired width, for example, corresponding to single form factor for the formed IC 515.

As shown in FIG. 5B, an unformed IC 520 may be prevented from falling through the separation system 500 when the separation system 500 is arranged above a void and the unformed IC 520 has a width greater than the width of the opening in the separation system 500. For example, when the unformed IC 520 does not comply with accepted dimensions and/or tolerances corresponding to the form factor of the formed IC 515, the separation system 500 may prevent the unformed IC 520 from passing vertically through the separation system 500 and into the void. In this way, unformed ICs 520 are separated from formed ICs 515 to mitigate jams occurring at machines later handling the formed ICs 515 and having openings configured to receive components complying with the accepted dimensions and/or tolerances corresponding to the form factor of the formed IC 515. Such mitigation may increase efficiency in handling and producing the formed ICs 515, thereby reducing manufacturing expense and elapsed time incurred in producing and testing the formed ICs 515.

While some examples of the separation system 500 are described in the present disclosure as allowing formed ICs 515 to pass though and retaining unformed ICs 520, other examples of the separation system 500 may be configured to retain properly formed ICs 515 while allowing unformed ICs 520 to pass through, both examples of which are included within the scope of the present disclosure. For example, when an unformed IC 520 may have a width less than an accepted dimension and/or tolerance corresponding to an intended form factor for the formed IC 515, the unformed IC 520 may pass through the opening in the separation system 500 and pass through the void while the formed IC 515 may be retained by the separation system 500 and advanced to a collection bin.

Figure 6:
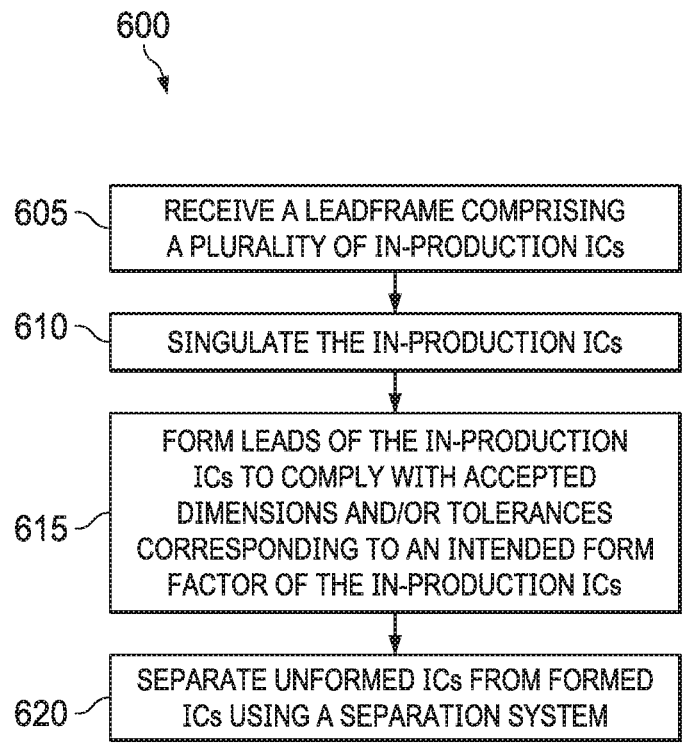
FIG. 6 shows a flowchart of an illustrative integrated circuit (IC) forming method.

Referring now to FIG. 6, a flowchart of an illustrative IC forming method 600 is shown. At least some aspects of the method 600 may be implemented by a forming machine, such as the forming machine 100, described above with reference to FIG. 1. The method 600 may be implemented, for example, to convert a leadframe of in-production ICs to completed ICs that are separated into formed ICs and unformed ICs prior to collection.

At operation 605, the forming machine receives a leadframe comprising a plurality of in-production ICs. The in-production ICs may be arranged in a grid pattern in the leadframe and may be coupled to the leadframe via leads of the in-production ICs.

At operation 610, the forming machine singulates the in-production ICs. The forming machine may singulate the in-production ICs from the leadframe by separating the in-production ICs from the leadframe according to any suitable means. In at least one example, the forming machine may singulate the in-production ICs by lowering a die press that applies downward pressure to the in-productions ICs (and/or to the leads of the in-production ICs) to separate the leads of the in-production ICs from the leadframe.

At operation 615, the forming machine forms the leads of the in-production ICs to comply with accepted dimensions and/or tolerances corresponding to an intended form factor of the in-production ICs. As discussed above with reference to FIGS. 1 and 2, forming the in-productions ICs may be performed in a plurality of progressive steps, for example, where a first forming operation partially forms leads of the in-productions ICs while subsequent forming operations further form the leads of the in-production ICs until a final forming operation is performed to complete forming of the leads of the in-production ICs. Also as discussed above, some in-production ICs may remain unformed despite the forming process, for example, as a result of errors in the forming process. The unformed ICs may differ from formed ICs in that the unformed ICs may not comply with the accepted dimensions and/or tolerances corresponding to the intended form factor for which the forming machine formed the in-production ICs.

At operation 620, the forming machine separates unformed ICs from formed ICs using a separation system, such as the separation system 425, discussed above with reference to FIG. 4. In at least one example, the forming machine separates the unformed ICs from the formed ICs automatically and/or without human intervention by advancing the completed ICs above the separation system which is arranged above a void. The formed ICs may pass through the separation system and fall through the void while the unformed ICs may be retained by the separation system and separated from the formed ICs. In other examples, the unformed ICs may pass through the separation system and fall through the void while the formed ICs may be retained by the separation system and separated from the unformed ICs. Some examples of the forming machine may further advance the unformed ICs along a surface of the separation system until the unformed ICs exit the forming machine, for example, into a collection bin.

While the operations of the method 600 have been discussed and labeled with numerical reference, the method 600 may include additional operations that are not recited herein, any one or more of the operations recited herein may include one or more sub-operations, any one or more of the operations recited herein may be omitted, and/or any one or more of the operations recited herein may be performed in an order other than that presented herein (e.g., in a reverse order, substantially simultaneously, overlapping, etc.), all of which is intended to fall within the scope of the present disclosure.

Figure 7:
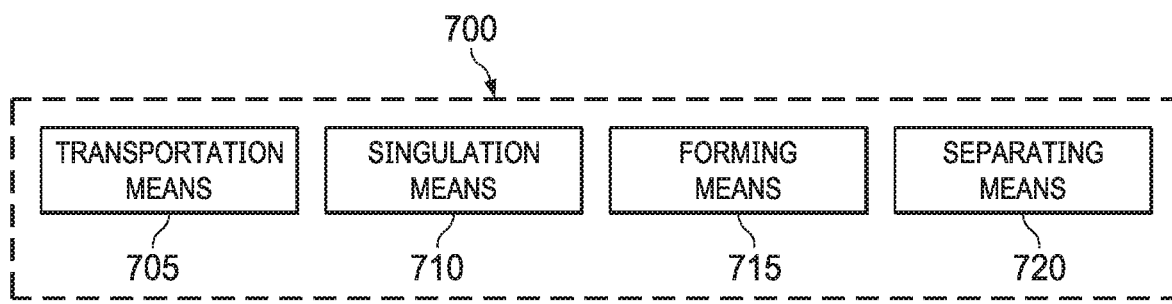
FIG. 7 shows a block diagram of an illustrative IC production system.

Referring now to FIG. 7, a block diagram of an illustrative IC production system 700 is shown. At least some aspects of the system 700 may be performed by the forming machine 100, discussed above with reference to FIG. 1. In at least one example, the system 700 may include a transportation means 705 for transporting a leadframe comprising in-production ICs through a forming machine to advance the in-production ICs from a first operation of a forming process (e.g., such as the method 600, described above with reference to FIG. 6) to a second operation of the forming process. The transportation means 705 may be, for example, a conveyor belt, a clamp or claw system, a sprocket mating with matching holes in the leadframe and spinning to advance the leadframe, and/or a roller spinning against a surface of the leadframe while under pressure to advance the leadframe at least partially via frictional forces. The transportation means 705 may advance the leadframe a distance based at least partially on a number of in-production ICs of the leadframe that are processed during a single operation of the forming process. During at least some operations of the forming process, the transportation means 705 advancing the leadframe may at least partially cause the leadframe to drag the in-production ICs through the forming machine.

The system 700 may also include a singulating means 710 for separating the in-production ICs from the leadframe. In at least one example, the singulating means 710 may separate the leads of the in-production ICs from the leadframe. The singulating means 710 may be, for example, a pressure-based means such as a die press that actuates to apply pressure to the leadframe, the in-productions ICs, and/or leads of the in-production ICs or a cutting means such as a saw, laser, or water jet that separates the leads from the leadframe by eliminating a portion of the leads and/or the leadframe at a defined location to maintain a desired lead length (e.g., at or near a point of coupling between the leads and the leadframe). In at least one example, the singulating means 710 may include a plurality of components. For example, the singulating means 710 may include a downward action of a die press applying pressure to a top surface of the leadframe, the in-productions ICs, and/or leads of the in-production ICs and a platform having features below a bottom surface of the leadframe, the in-productions ICs, and/or leads of the in-production ICs that at least partially aid in the singulating.

The system 700 may also include a forming means 715 for forming the in-productions ICs according to dimensions and/or tolerances of a desired form factor upon which the forming is at least partially based. In at least one example, the forming means 715 may form the leads of the in-production ICs to conform to the dimensions and/or tolerances of the desired form factor. For example, a given form factor may specify a minimum and/or maximum pitch (distance) between leads of a formed IC and the forming means 715 may form the in-production ICs to comply with the minimum and/or maximum pitch. In at least one example, at least some of the in-production ICs become formed ICs after the forming and at least some of the in-production ICs become unformed ICs (e.g., when the forming has not been successfully performed) after the forming. The forming means 715 may be, for example, a pressure-based means such as a die press that actuates to apply pressure to the leads to form the leads or a claw-based system in which an end of the leads is retained with a claw or other articulable grabbing structure and bent to form the desired form factor. In at least one example, a die press utilized as the singulating means 710 may at least partially be used as the forming means. For example, the die press may have multiple sections adapted for different uses (e.g., a singulating section and a forming section) or a platform beneath the leads may vary for singulating and forming to provide the desired forming. In at least one example, the forming means 715 may include a plurality of components. For example, the forming means 715 may include a downward action of a die press applying pressure to the leads of the in-production ICs and a platform having features below a bottom surface of the leads of the in-production ICs that at least partially aid in the forming. In some examples, the forming is performed over a plurality of progressive forming operations that each partially forms the leads of the in-production ICs.

In at least one example, the system 700 may also include a separating means 720 for automatically separating formed ICs from unformed ICs after the forming without human intervention to perform the separating. In at least one example, the separating means 720 may separate the formed ICs from the unformed ICs according to size. The separating means may be, for example, an aperture based means in which ICs of a first size pass through an opening and ICs of a second size do not pass through an opening, a pneumatic means in which sensors (e.g., such as optical sensors) detect an unformed IC and the pneumatic means separates the unformed IC from the formed ICs (e.g., such as by exerting a burst of gas that dislodges the unformed IC from a path shared with the formed ICs), or a gate based system in which sensors (e.g., such as optical sensors) detect an unformed IC and a gate articulates to divert the unformed IC from a path shared with the formed ICs and along which the formed ICs are permitted to continue. The separating means may be an automatic means, for example, such that unformed ICs are automatically identified among the formed ICs by the forming machine and separated from the formed ICs without requiring a human to manually identify the unformed ICs and/or manually remove the unformed ICs from among the formed ICs. In at least one example, the separating means 720 may be adjustable to accommodate desired form factors having varying dimensions and/or tolerances. In some examples, each of the transportation means 705, the singulating means 710, the forming means 715, and the separating means 720 are implements in (or by) a single device, while in other examples any one or more of the transportation means 705, the singulating means 710, the forming means 715, and/or the separating means 720 are implemented in separate devices that may be configured to interact with one another.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. A device that is "configured to" perform a task or function may be configured (e.g., programmed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various examples of the present disclosure. Numerous variations and modifications will become apparent to those skilled in the art once the above disclosure is fully appreciated. It is intended that the following claims be interpreted to embrace all such variations and modifications.

What is claimed is:

1. An integrated circuit (IC) production method, comprising:
   receiving, by an IC forming machine, a leadframe comprising a plurality of ICs;
   singulating, by the IC forming machine, the plurality of ICs;
   forming, by the IC forming machine, leads of at least some of the plurality of singulated ICs and
   separating, automatically by the IC forming machine, singulated ICs with formed leads having expected dimensions from singulated ICs with formed leads having other than the expected dimensions.

2. The IC production method of claim 1, wherein the forming is intended to produce formed ICs complying with the dimensions and tolerances corresponding to a preselected IC package.

3. The IC production method of claim 1, wherein the forming machine separates the singulated ICs with formed leads having expected dimensions from the singulated ICs with formed leads having other than the expected dimensions using a separation system.

4. The IC production method of claim 1, wherein the forming machine separates the singulated ICs with formed leads having expected dimensions from the singulated ICs with formed leads having other than the expected dimensions without human intervention.

5. The IC production method of claim 1, wherein the expected dimensions include a minimum and/or maximum distance between leads of the in-production ICs.

6. The IC production method of claim 1, wherein the forming leads includes bending each lead in at least one direction.

7. The IC production method of claim 1, wherein the forming leads includes bending each lead in at least two directions.

8. An integrated circuit (IC) production method, comprising:
   receiving, by an IC forming machine, a leadframe comprising a plurality of in-production ICs;
   singulating, by the IC forming machine, the plurality of in-production ICs;
   forming, by the IC forming machine, leads of at least some of the plurality of in-production ICs to comply with intended dimensions and tolerances corresponding to the plurality of in-production ICs; and
   separating, automatically by the forming machine, formed ICs from unformed ICs after the forming, wherein the formed ICs fall via gravity through a void in the forming machine and the unformed ICs are prevented from falling through the void in the forming machine.

9. The IC production method of claim 8, wherein the intended dimensions include a minimum and/or maximum distance between leads of the in-production ICs.

10. The IC production method of claim 8, wherein the forming leads includes bending each lead in at least one direction.

11. The IC production method of claim 8, wherein the forming leads includes bending each lead in at least two directions.

12. An integrated circuit (IC) production method, comprising:
receiving, by an IC forming machine, a leadframe comprising a plurality of in-production ICs;
singulating, by the IC forming machine, the plurality of in-production ICs;
forming, by the IC forming machine, leads of at least some of the plurality of in-production ICs to comply with intended dimensions and tolerances corresponding to the plurality of in-production ICs; and
separating, automatically by the forming machine, formed ICs from unformed ICs after the forming, wherein the unformed ICs fall via gravity through a void in the forming machine and the formed ICs are prevented from falling through the void in the forming machine.

13. The IC production method of claim 12, wherein the intended dimensions include a minimum and/or maximum distance between leads of the in-production ICs.

14. The IC production method of claim 12, wherein the forming leads includes bending each lead in at least one direction.

15. The IC production method of claim 12, wherein the forming leads includes bending each lead in at least two directions.

16. A method of making integrated circuit (ICs), comprising:
singulating ICs from a leadframe;
forming leads of the singulated ICs; and
automatically separating the singulated ICs having formed leads and first dimensions from the singulated ICs having formed leads and other than the first dimensions after the forming without human intervention to perform the separating.

17. The method of claim 16, wherein the singulating and the forming are implemented in a same physical component.

18. The method of claim 16, wherein the singulating and the forming are implemented in an upper die configured to interact with a lower die to implement the singulating and the forming.

19. A method of making integrated circuit (ICs), comprising:
singulating ICs from a leadframe;
forming leads of the singulated ICs; and
automatically separating the singulated ICs having formed leads and first dimensions from the singulated ICs having formed leads and other than the first dimensions after the forming without human intervention to perform the separating, wherein an aperture based means is used for automatically separating the singulated ICs having first dimensions from the singulated ICs having other than the first dimensions.

20. A method of making integrated circuit (ICs), comprising:
singulating in-production ICs from a leadframe;
forming the in-production ICs according to intended dimensions upon which the forming is at least partially based by means for forming the in-production ICs; and
automatically separating formed ICs from unformed ICs by a means for forming the in-production ICs, after the forming without human intervention to perform the separating, wherein the means for the automatically separating the formed ICs is detachably coupled to at least a portion of the means for forming the in-productions ICs.

21. A method of making integrated circuit (ICs), comprising:
singulating ICs from a leadframe;
forming leads of the singulated ICs; and
automatically separating the singulated ICs having formed leads and first dimensions from the singulated ICs having formed leads and other than the first dimensions after the forming without human intervention to perform the separating wherein a transporting means advances the singulated ICs having the first dimensions to a first location in a forming machine and the singulated ICs having other than the first dimensions to a second location in the forming machine.

22. A method of making integrated circuit (ICs), comprising:
singulating in-production ICs from a leadframe;
forming the in-production ICs according to intended dimensions upon which the forming is at least partially based; and
automatically separating formed ICs from unformed ICs after the forming without human intervention to perform the separating, wherein the formed ICs fall via gravity through a void in a forming machine and the unformed ICs are prevented from falling through the void in the forming machine.

23. A method of making integrated circuit (ICs), comprising:
singulating in-production ICs from a leadframe;
forming the in-production ICs according to intended dimensions upon which the forming is at least partially based; and
automatically separating formed ICs from unformed ICs after the forming without human intervention to perform the separating, wherein the unformed ICs fall via gravity through a void in a forming machine and the formed ICs are prevented from falling through the void in the forming machine.

24. A method of making an integrated circuit (IC), comprising:
singulating the IC from a leadframe;
forming leads of the IC; and
automatically separating the singulated IC based upon dimensions of the singulated IC from other singulated ICs having different dimensions after the forming without human intervention to perform the separating.

25. The method of claim 24, wherein the singulating and the forming are implemented in a same physical component.

26. The method of claim 24, wherein the singulating and the forming are implemented in an upper die configured to interact with a lower die to implement the singulating and the forming.

27. A method of making an integrated circuit (IC), comprising:
singulating the IC from a leadframe;
forming leads of the IC; and
automatically separating the singulated IC based upon dimensions of the singulated IC from other singulated ICs having different dimensions after the forming without human intervention to perform the separating, wherein an aperture based means is used for automatically separating the in-production ICs having first dimensions from the in-production ICs having other than the first dimensions.

28. A method of making an integrated circuit (IC), comprising:
   singulating the IC from a leadframe;
   forming the IC according to intended dimensions upon which the forming is at least partially based by a means for forming in-production ICs; and
   automatically separating the formed IC from unformed ICs by a means for automatically separating the formed ICs after the forming without human intervention to perform the separating, wherein the means for the automatically separating the formed ICs is detachably coupled to at least a portion of the means for forming the in-productions ICs.

29. A method of making an integrated circuit (IC), comprising:
   singulating the IC from a leadframe;
   forming leads of the IC; and
   automatically separating the singulated IC based upon dimensions of the singulated IC from other singulated ICs having different dimensions after the forming without human intervention to perform the separating, wherein a transporting means advances the ICs having the first dimensions to a first location in a forming machine and the ICs having other than the first dimensions to a second location in the forming machine.

30. A method of making an integrated circuit (IC), comprising:
   singulating the IC from a leadframe;
   forming the IC according to intended dimensions upon which the forming is at least partially based; and
   automatically separating the formed IC from unformed ICs after the forming without human intervention to perform the separating, wherein the formed ICs fall via gravity through a void in a forming machine and the unformed ICs are prevented from falling through the void in the forming machine.

31. A method of making an integrated circuit (IC), comprising:
   singulating the IC from a leadframe;
   forming the IC according to intended dimensions upon which the forming is at least partially based; and
   automatically separating the formed IC from unformed ICs after the forming without human intervention to perform the separating, wherein the unformed ICs fall via gravity through a void in a forming machine and the formed ICs are prevented from falling through the void in the forming machine.

\* \* \* \* \*